(12) United States Patent
Nakashiba

(10) Patent No.: US 11,710,695 B2
(45) Date of Patent: Jul. 25, 2023

(54) SEMICONDUCTOR DEVICE AND METHOD OF MANUFACTURING THE SAME

(71) Applicant: RENESAS ELECTRONICS CORPORATION, Tokyo (JP)

(72) Inventor: Yasutaka Nakashiba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/872,848

(22) Filed: May 12, 2020

(65) Prior Publication Data

US 2020/0411434 A1 Dec. 31, 2020

(30) Foreign Application Priority Data

Jun. 25, 2019 (JP) ................................ 2019-117576

(51) Int. Cl.
*H01L 29/00* (2006.01)
*H01L 23/522* (2006.01)
(Continued)

(52) U.S. Cl.
CPC .......... *H01L 23/5227* (2013.01); *H01L 21/56* (2013.01); *H01L 23/291* (2013.01);
(Continued)

(58) Field of Classification Search
CPC ..... H01L 25/07–074; H01L 25/11–117; H01L 25/16–167; H01L 25/18;
(Continued)

(56) References Cited

U.S. PATENT DOCUMENTS

| 4,780,795 A | * | 10/1988 | Meinel ................. H01F 17/062 |
| | | | 257/E25.031 |
| 5,422,615 A | * | 6/1995 | Shibagaki ............... H01L 23/66 |
| | | | 257/704 |

(Continued)

FOREIGN PATENT DOCUMENTS

| CN | 106611761 A | * | 5/2017 | .......... H01L 21/762 |
| JP | 06-310591 A | | 11/1994 | |

(Continued)

OTHER PUBLICATIONS

Japanese Notice of Reasons for Refusal issued in corresponding Japanese Patent Application No. 2019-117576, dated Sep. 6, 2022, with English translation.

*Primary Examiner* — Mary A Wilczewski
*Assistant Examiner* — Tsk K Chiu
(74) *Attorney, Agent, or Firm* — McDermott Will & Emery LLP

(57) ABSTRACT

A semiconductor device has a substrate, a first circuit, a first inductor, a second circuit and a second inductor IND2. The substrate includes a first region and a second region, which are regions different from each other. The first circuit is formed on the first region. The first inductor is electrically connected with the first circuit. The second circuit is formed on the second regions. The second inductor is electrically connected with the second circuit and formed to face the first inductor. A penetrating portion is formed in the substrate. The penetrating portion is formed such that the penetrating portion surrounds one or both of the first circuit and the second circuit in plan view.

20 Claims, 19 Drawing Sheets

(51) Int. Cl.
*H01L 23/64* (2006.01)
*H01L 21/56* (2006.01)
*H01L 23/29* (2006.01)
*H01L 23/00* (2006.01)
*H01L 23/31* (2006.01)

(52) U.S. Cl.
CPC ........ *H01L 23/3121* (2013.01); *H01L 23/645* (2013.01); *H01L 24/29* (2013.01)

(58) Field of Classification Search
CPC ..... H01L 21/76224–76237; H01L 21/823481; H01L 21/823878; H01L 29/66772–6678; H01L 29/78603; H01L 29/78657; H01L 24/29; H01L 24/05; H01L 24/06; H01L 24/32; H01L 24/48; H01L 23/5227; H01L 23/291; H01L 23/3121; H01L 23/645; H01L 23/3107; H01L 27/06; H01L 27/0617; H01L 27/0688
See application file for complete search history.

(56) References Cited

U.S. PATENT DOCUMENTS

| | | | |
|---|---|---|---|
| 7,741,148 B1* | 6/2010 | Marimuthu | H01L 25/0655 438/106 |
| 9,871,036 B2 | 1/2018 | Nakashiba et al. | |
| 2002/0070439 A1* | 6/2002 | Hiramatsu | H01L 23/295 257/687 |
| 2002/0132414 A1* | 9/2002 | Lung | H01L 27/11546 257/E27.081 |
| 2005/0213280 A1* | 9/2005 | Azrai | H01L 23/5223 361/271 |
| 2006/0105496 A1* | 5/2006 | Chen | H01L 25/18 438/106 |
| 2007/0077747 A1* | 4/2007 | Heck | H01L 23/49827 438/618 |
| 2010/0259909 A1* | 10/2010 | Ho | H03H 7/46 361/767 |
| 2010/0265024 A1* | 10/2010 | Nakashiba | H01L 25/0655 336/200 |
| 2011/0012199 A1* | 1/2011 | Nygaard | H01L 21/84 257/E23.101 |
| 2011/0049693 A1 | 3/2011 | Nakashiba et al. | |
| 2012/0020419 A1* | 1/2012 | Kaeriyama | H04L 25/4902 375/259 |
| 2014/0035158 A1* | 2/2014 | Chang | H01L 24/92 257/774 |
| 2015/0130022 A1* | 5/2015 | Watanabe | H04B 5/005 257/531 |
| 2015/0171934 A1* | 6/2015 | Brauchler | H01L 21/565 455/41.1 |
| 2016/0035672 A1* | 2/2016 | Funaya | H01L 27/0617 438/381 |
| 2016/0093570 A1* | 3/2016 | Watanabe | H01L 23/3107 257/531 |
| 2018/0122719 A1* | 5/2018 | Kwak | H01L 23/5328 |

FOREIGN PATENT DOCUMENTS

| | | |
|---|---|---|
| JP | 2004-071997 A | 3/2004 |
| JP | 2011-054800 A | 3/2011 |
| JP | 2014-183071 A | 9/2014 |
| JP | 2017-507494 A | 3/2017 |
| WO | 2015/128479 A1 | 9/2015 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2019-117576 filed on Jun. 25, 2019 including the specification, drawings and abstract is incorporated herein by reference in its entirety.

BACKGROUND

It relates to a semiconductor device and method of manufacturing the semiconductor device, for example a semiconductor device and method of manufacturing the semiconductor device including an inductor.

There is a disclosed technique listed below.

[Patent Document 1] Japanese Unexamined Patent Application Publication No. 2011-054800

A semiconductor device including a first semiconductor chip in which a semiconductor element for power is formed and a second semiconductor chip in which a semiconductor element for MCU is formed is known (for example, see Patent Document 1). Here, a driving voltage of the semiconductor element for power is about several hundred volts. On the other hand, a driving voltage of the semiconductor element for MCU is about several volts.

In semiconductor device described in Patent Document 1, a first semiconductor chip includes a first semiconductor substrate, a semiconductor element for power formed on the first semiconductor substrate, and a first inductor electrically connected with the semiconductor element for power. A second semiconductor chip includes a second semiconductor substrate, a semiconductor element for MCU formed on the second semiconductor substrate, and a second inductor electrically connected with the semiconductor element for MCU.

The first semiconductor chip and the second semiconductor chip are assembled such that the first inductor and second inductor face each other. The semiconductor element for power and the semiconductor element for MCU transmit signals to each other by electromagnetic inductive coupling via the first inductor and second inductor.

However, a semiconductor device described in Patent Document 1 is manufactured by assembling two semiconductor chips. Compared with the case that a single chip is used for manufacturing a semiconductor device, there is a room for improvement from the viewpoint of miniaturization of a semiconductor device.

A problem of embodiments is to miniaturization of the semiconductor device. Other problems and novel features will become apparent from the description of the specification and drawings.

SUMMARY

A semiconductor device according to embodiments includes a substrate, a first circuit, a first inductor, a second circuit, and a second inductor. The substrate includes a first region and a second region, which are regions different from each other. The first circuit is formed on the first region. The first inductor is electrically connected with the first circuit. The second circuit is formed on the second region. The second inductor is electrically connected with the second circuit and formed such that the second inductor faces the first inductor. A penetrating portion is formed in the substrate. The penetrating portion is formed such that the penetrating portion surrounds one or both of the first circuit and the second circuit in plan view.

A method of manufacturing a semiconductor device according to the embodiments includes providing a semiconductor wafer and forming a penetrating portion in a substrate of the semiconductor wafer.

According to embodiments, a semiconductor device can be miniaturized.

DETAILED DESCRIPTION

Figure 1:
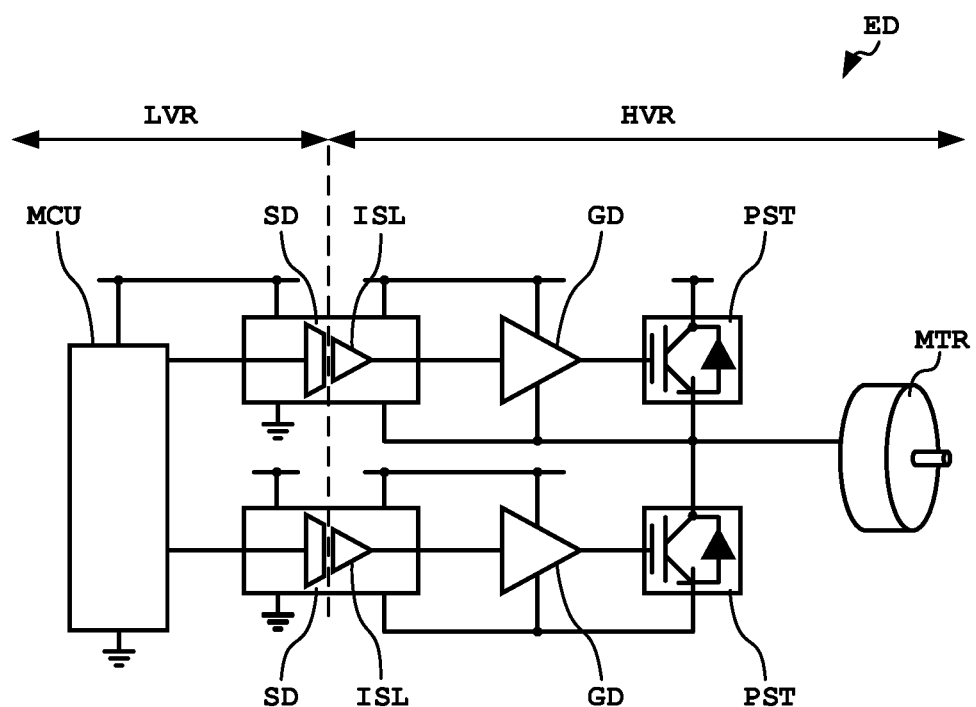
FIG. 1 is a block diagram showing an exemplary configuration of an electronic device according to an embodiment.

Hereinafter, a semiconductor device according to an embodiment will be described in detail by referring to the drawings. In the specification and the drawings, the same or corresponding element is denoted by the same reference numerals, and a repetitive description thereof is omitted. In the drawings, for convenience of description, the configuration may be omitted or simplified. A cross-sectional view may also be shown as an end view.

FIG. 1 is a block diagram showing an exemplary configuration of an electronic device ED according to a present embodiment.

As shown in FIG. 1, the electronic device ED includes a microcomputer MCU, a semiconductor device SD, a gate driver GD, a power-semiconductor device PST, and a motor MTR. In the electronic device ED, the number of the respective elements is not particularly limited, and may be one or plural. The semiconductor device SD includes a digital isolator ISL.

Except for the configuration of the semiconductor device SD, the configuration of the respective elements may be a known configuration employed in the art of digital isolator. The semiconductor device SD will be described later in detail.

In the electronic device ED, for example, a signal for driving the motor MTR is transmitted from the microcomputer MCU to the gate driver GD. At this time, the digital isolator ISL is disposed between the high voltage region HVR and the low voltage region LVR. The digital isolator ISL transmits a signal between the high voltage region HVR and the low voltage region LVR. More specifically, in the digital isolator ISL, a signal is transmitted by inductive coupling through two inductors. Therefore, a signal is transmitted in a state in which the microcomputer MCU driven by the low voltage and the gate driver driven by the high voltage are electrically isolated from each other.

Figure 2:
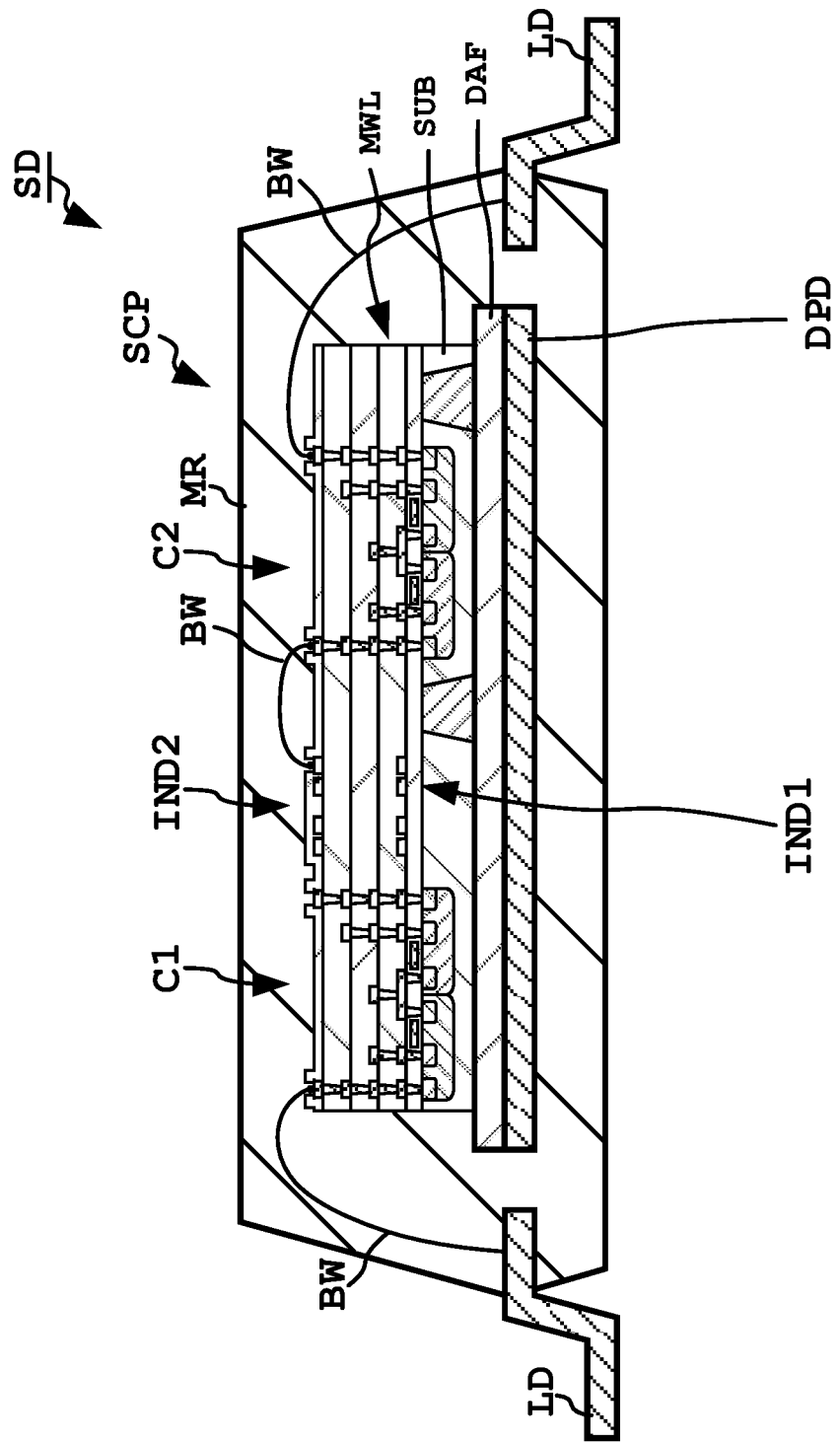
FIG. 2 is a cross-sectional view showing an exemplary configuration of a main portion of the semiconductor device according to the embodiment.

FIG. 2 is a cross-sectional view showing an exemplary configuration of a main portion of a semiconductor device SD according to the present embodiment.

The semiconductor device SD includes a die pad DPD, an adhesive layer DAF, a semiconductor chip SCP, a lead LD, and a sealing resin MR.

The die pad DPD is a member for supporting the semiconductor chip SCP. As for a configuration of the die pad DPD, a known configuration can be adopted as a die pad in a semiconductor art.

The adhesive layer DAF has insulating properties and is an adhesive member for fixing the semiconductor chip SCP on the die pad DPD. The adhesive layer DAF may be, for example, a die attachment film. Since the adhesive layer DAF is insulating layer, conduction between the first circuit C1 and the second circuit C2 through the adhesive layer DAF is suppressed. The first circuit C1 and second circuit C2 are also prevented from conducting by the adhesive layer DAF through the die pad DPD.

The semiconductor chip SCP is disposed directly on the die pad DPD through the adhesive layer DAF. The semiconductor chip SCP corresponds to the digital isolator ISL in electronic device ED, see FIG. 1. The semiconductor chip SCP is electrically connected with the lead LD through a bonding wire BW. The first circuit C1 and the second circuit C2 of the semiconductor chip SCP are electrically connected with the lead LD. Details of the semiconductor chip SCP will be described later.

The lead LD is a conductive member for electrically connecting the first circuit C1 and the second circuit C2 in the semiconductor chip SCP to an external circuit. As for the configuration of the lead LD, a configuration known as a lead in the semiconductor art can be adopted.

The sealing resin MR seals the die pad DPD, the adhesive layer DAF, the semiconductor chip SCP, a portion of the lead LD, and the bonding wire BW. As for the configuration of the sealing resin MR, a configuration known as a sealing resin in the semiconductor art can be adopted.

[Configuration of the Semiconductor Chip]

Figure 3:
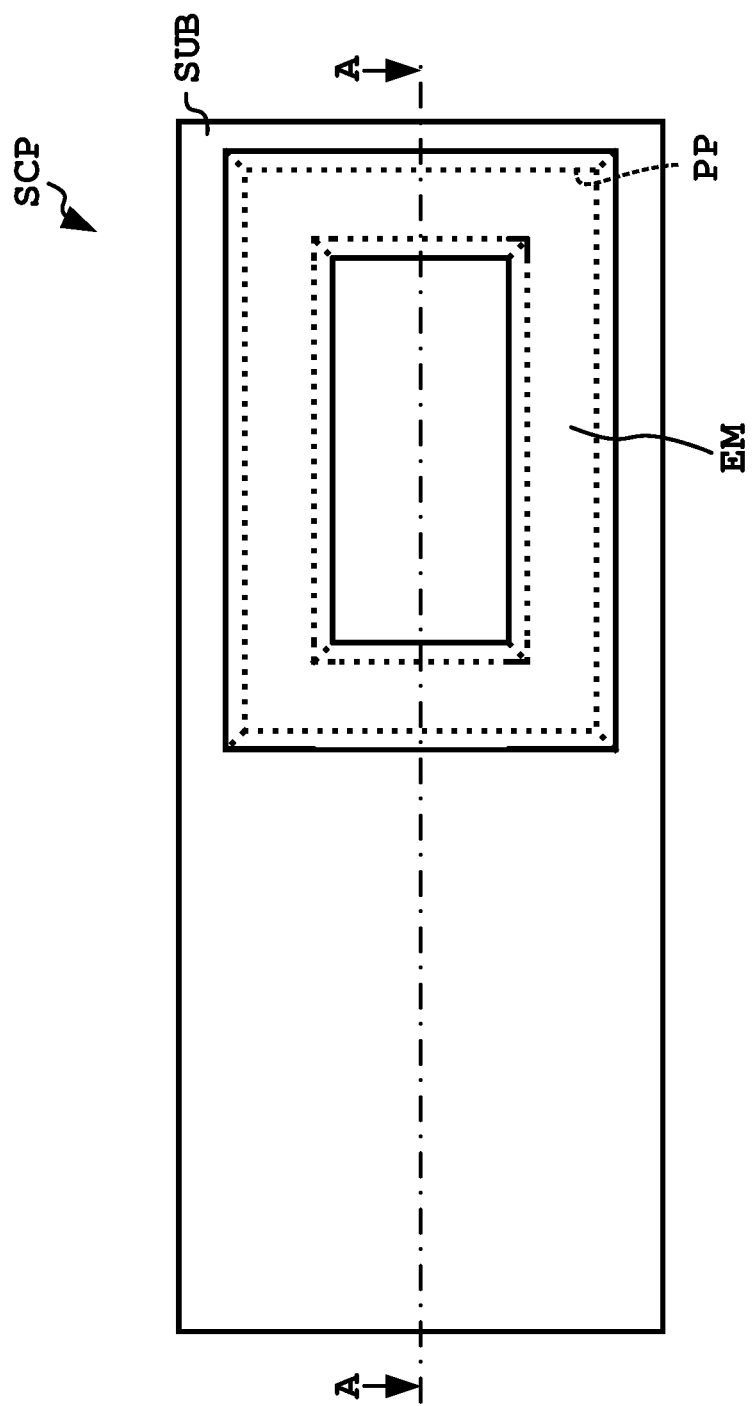
FIG. 3 is a bottom view showing an exemplary configuration of a main portion of a semiconductor chip according to the embodiment.
Figure 4:
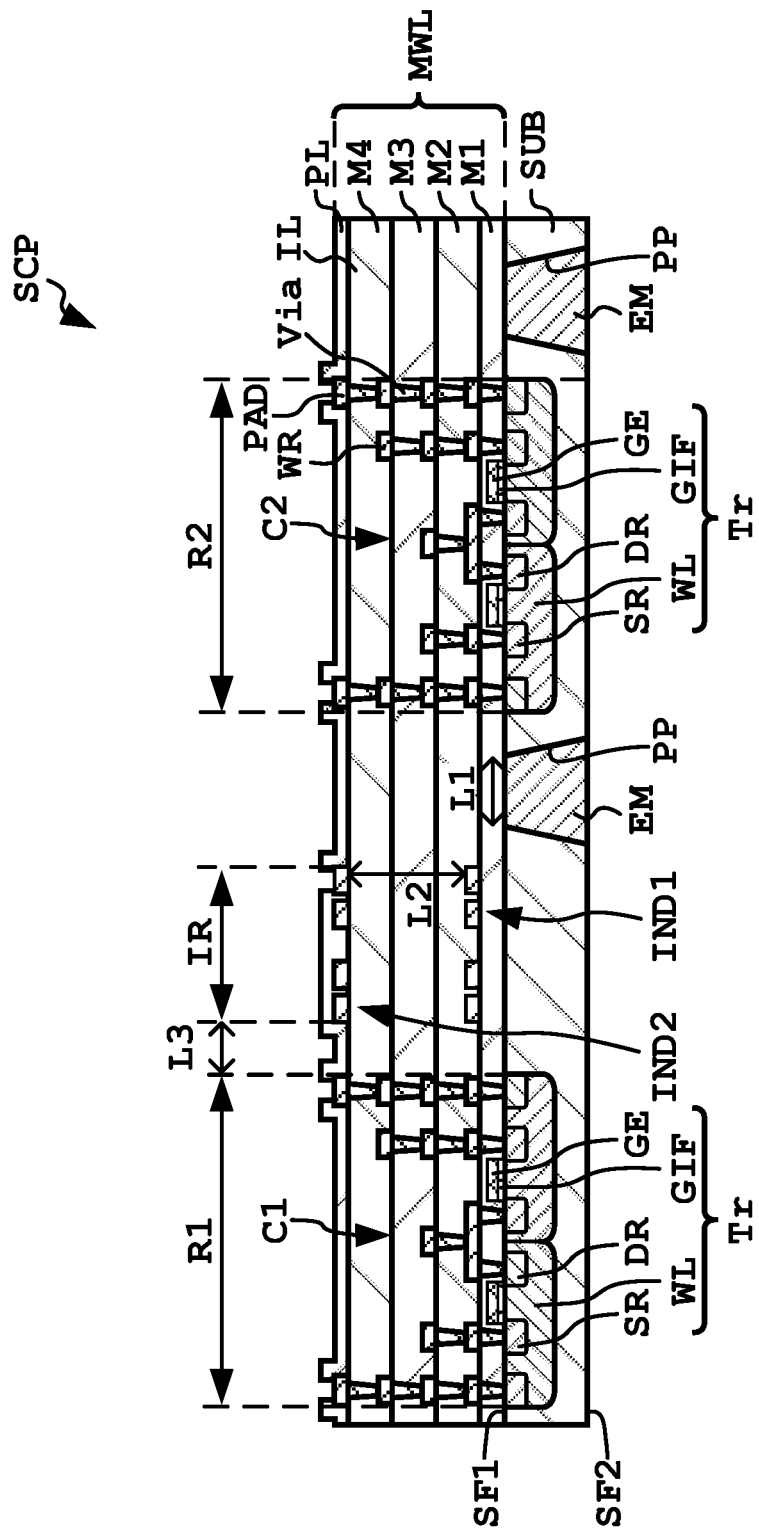
FIG. 4 is a cross-sectional view showing an exemplary configuration of a main portion of the semiconductor chip according to the embodiment.

FIG. 3 is a bottom view showing an exemplary configuration of a main portion of the semiconductor chip SCP according to the present embodiment. FIG. 4 is a cross-sectional view showing an exemplary configuration of the main portion of the semiconductor chip SCP according to the present embodiment. FIG. 4 is a cross-sectional view taken along line A-A in FIG. 3.

The semiconductor chip SCP includes a substrate SUB, an embedded member EM, a first circuit C1, a second circuit C2, a multilayer wiring layer MWL, and a protective layer PL. The multilayer wiring layer MWL includes a first inductor IND1, a second inductor IND2, a via Via, a wiring WR, and a pad PAD.

As shown in FIG. 2, the substrate SUB is fixed on the die pad DPD through the adhesive layer DAF. As shown in FIG. 4, the substrate SUB includes a first surface (front surface) SF1 and a second surface (back surface) SF2 which are in front and back relation to each other. In other words, the first surface SF1 is a surface of substrate SUB that is positioned opposite to second surface SF2. The first surface SF1 is a surface on which a semiconductor element is formed. The substrate SUB is made of, for example, monocrystalline silicon (Si). A well region WL, a source region SR, and a drain region DR are formed in the substrate SUB.

A penetrating portion PP is formed on the second surface SF2 of substrate SUB. The penetrating portion PP penetrates the substrate SUB in a thickness direction of the substrate SUB. That is, the multilayer wiring layer MWL is exposed at the bottom of the penetrating portion PP. In other words, the penetrating portion PP opens to both the first surface SF1 and second surface SF2.

The shapes, sizes, numbers, and positions of the penetrating portions PP are not particularly limited as long as the first circuit C1 and the second circuit C2 can be electrically insulated from each other through the substrate SUB.

A width L1 of the penetrating portion PP in the first surface SF1 is preferably large from the viewpoint of increasing the breakdown voltage of the semiconductor chip SCP. For example, when the desired breakdown voltage is 2000 V or more, the width L1 is preferably 1 μm or more and 30 μm or less.

A distance L2 between the first inductor IND1 and second inductor IND2 in a facing direction of the first inductor IND1 and the second inductor IND2 is preferably large from the viewpoint of increasing the breakdown voltage of the semiconductor chip SCP. A distance L2 is preferably small from the viewpoint of increasing a coupling coefficient of the first inductor IND1 and second inductor IND2. For example, when the desired breakdown voltage is 2000 V or more, the distance L2 is preferably 1 μm or more and 30 μm or less.

A distance L3 between the second inductor IND2 and a wiring constituting the first circuit C1 in a direction along the surface of the substrate SUB is preferably large from the viewpoint of increasing the breakdown voltage of the semiconductor chip SCP. For example, when the desired breakdown voltage is 2000 V or more, the distance L3 is preferably 1 μm or more and 30 μm or less.

As described above, from the viewpoint of ensuring the withstand voltage of the semiconductor chip SCP, the width L1, the distance L2, and the distance L3 are preferably large. On the other hand, from the viewpoint of increasing the coupling coefficient of the first inductor IND1 and of the second inductor IND2, the distance L2 is preferably small. Therefore, the distance L2 is preferably smaller than the width L1 and the distance L3. As a result, the coupling coefficient of the first inductor IND1 and second inductor IND2 can be increased while suppressing the generation of leakage current in the semiconductor chip SCP.

Here, the width L1 of the penetrating portion PP is a distance between two inner surfaces of the penetrating portion PP facing each other in the first surface SF1. The distance L2 is a distance between the first inductor IND1 and second inductor IND2 in facing direction of the first inductor IND1 and the second inductor IND2. In present embodiment, the facing direction of the first inductor IND1 and the second inductor IND2 is the same as a thickness direction of the multilayer wiring layer MWL.

The number of the penetrating portion PP may be one or two or more. In present embodiment, the number of penetrating portion PP is one.

The position of the penetrating portion PP is also not particularly limited. For example, the penetrating portion PP is formed such that the penetrating portion PP surrounds the first circuit C1 or the second circuit C2 in plan view. In present embodiment, the penetrating portion PP is formed such that the penetrating portion PP surrounds the second circuit C2 in plan view. It is preferable that the penetrating portion PP is formed in a region which does not overlap with an inductor region IR in which the first inductor IND1 and the second inductor IND2 are formed in plan view. When the inductor region IR and the penetrating portion PP overlap each other, the distance between the inner surfaces of the penetrating portion PP (of substrate SUB, a portion where the second circuit C2 is formed) and the first inductor IND1 needs to be considered, and a design parameter is increased. Since the penetrating portion PP does not overlap with the inductor region IR, an increase of the design parameter can be suppressed.

The embedded member EM is embedded in the penetrating portion PP. From the viewpoint of increasing a strength of the substrate SUB, it is preferable that the embedded member EM is formed in the penetrating portion PP. The embedded member EM may or may not fill the penetrating portion PP. From the viewpoint of further increasing the strength of the substrate SUB, it is preferable that the embedded member EM fills the inside of the penetrating portion PP.

A material of the embedded member EM may have insulating property, and the penetrating portion PP may be embedded by the buried member EM. Examples of the embedded member EM include a resin layer and an inorganic film. A material of the resin layers is, for example, a liquid curable resin material SUNCONNECT manufactured by Nissan Chemical Industry Co., Ltd. ("SUNCONNECT" is a registered trademark of the same company). For example, the inorganic film is a film containing one or both of an oxygen atom and a nitrogen atom. Examples of materials for the inorganic film include silicon oxide, silicon oxynitride, and silicon nitride.

The substrate SUB includes a first region R1, a second region R2, and the inductor region IR. The first circuit C1 is formed on the first region R1. The second circuit C2 is formed on the second region R2. The first inductor IND1 and the second inductor IND2 are formed over the inductor area IR. In present embodiment, the penetrating portion PP is formed such that the penetrating portion PP surrounds the second area R2 in plan view. In other words, the penetrating portion PP surrounds the second circuit C2 in plan view.

Here, the first region R1 is a region which does not overlap with the inductor region IR in the substrate SUB among regions which are electrically isolated from the second circuit C2. The second region R2 is a region composed of a region in which the penetrating portion PP is formed and a region surrounded by the penetrating portion PP in the substrate SUB.

The first circuit C1 is a transmitting circuit or a receiving circuit. The first circuit C1 includes a transistor Tr. The transistor Tr includes, for example, a well region WL, a source region SR, a drain region DR, a gate dielectric film GIF, and a gate electrode GE.

The second circuit C2 is a transmitting circuit or a receiving circuit. When the first circuit C1 is a transmitting circuit, the second circuit C2 is a receiving circuit. The second circuit C2 also includes a transistor Tr. The second circuit C2 is electromagnetically coupled with the first circuit C1 through the first inductor IND1 and the second inductor IND2. The second circuit C2 is electrically isolated from the first circuit C1.

The multilayer wiring layer MWL is a layer composed of two or more wiring layers. The multilayer wiring layer MWL is formed on the substrate SUB. The multilayer wiring layer MWL is a layer including an interlayer insulating layer and one or both of wiring and via (also referred to as "plug") formed in the interlayer insulating layer. The via is a conductive member which electrically connects two wiring formed in layers which differ from each other. In the present embodiment, multilayer wiring layer MWL includes a first inductor IND1, a second inductor IND2, four wiring layers M1-M4, and a pad PAD.

The first inductor IND1 is electrically connected with the first circuit C1. The first inductor IND1 is formed in the multilayer wiring layer MWL. The position of the first inductor IND1 is not particularly limited. In the present embodiment, the first inductor IND1 is formed in the wiring layer M2. The shape of the first inductor IND1 in plan view is a spiral shape or an annular shape. Examples of materials for the first inductor IND1 include copper (Cu) and aluminum (Al).

Examples of the shape of the first inductor IND1 in plan view include a substantially square shape, a substantially octagonal shape, and a substantially circular shape. The number of turns of the first inductor IND1 is not particularly limited, and may be one, eight, or ten.

The second inductor IND2 is electrically connected with the second circuit C2. The first inductor IND1 is formed in the multilayer wiring layer MWL. The second inductor IND2 is formed at a position facing the first inductor IND1. The second inductor IND2 may be formed in the multilayer wiring layer MWL or may be formed in a redistribution line layer formed on the protective layer PL. The second inductor IND2 may be formed in the same layer as the first inductor IND1, or may be formed in a different layer from the first inductor IND1. In the present embodiment, the second inductor IND2 is formed on the wiring layer M4 and is formed in the same layer as the pad PAD. Examples of shapes and materials of the second inductor IND2 are similar to those of the first inductor IND1. A thickness of the second inductor IND2 may be greater than or equal to a thickness of the first inductor IND1.

Examples of the plan view shape of the second inductor IND2 include a substantially square shape, a substantially octagonal shape, and a substantially circular shape. The number of turns of the second inductor IND2 is not particularly limited, and may be one, eight, or ten. The plan view shape of the second inductor IND2 may be the same as or different from the plan view shape of the first inductor IND1. The material of the second inductor IND2 may be the same as or different from the material of the first inductor IND1.

The wiring layers M1 to M4 are formed on the substrate SUB. The wiring layer M1 includes an interlayer insulating layer IL and a via Via formed in the interlayer insulating layer IL. The wiring layer M2-M4 includes an interlayer insulating layer IL and a wiring WR and a via formed in the interlayer insulating layer IL. Materials for the interlayer insulating layer IL are, for example, silicon oxide. Examples of materials of the wiring WR include copper and aluminum. Examples of materials of the via Via include copper, aluminum and tungsten.

The pad PAD is formed in an uppermost layer of the multilayer wiring layer MWL and exposed from the multilayer wiring layer MWL. A portion of the pad PAD is exposed from the protective layer PL. The remainder of the pad PAD is covered with the protective layer PL. Of the pad PAD, the portion exposed from the protective layer PL is connected with a wiring such as a bonding wire BW.

It is preferable that, of the pad PAD, the portion exposed from the protective layer PL is formed at a position without overlapping with the penetrating portion PP in plan view. As a result, damage to the semiconductor chip SCP at the time of bonding can be reduced.

The protective layer PL protects the semiconductor chip SCP. The protective layer PL is formed on the multilayer wiring layer MWL. The protective layer PL is, for example, silicon nitride.

Here, the function of the penetrating portion PP in the semiconductor device SD according to the present embodiment will be described.

In the present embodiment, the first circuit C1 and the second circuit C2 are both formed on the substrate SUB. The first circuit C1 and the second circuit C2 constitute a pair of a receiving circuit and a transmitting circuit. As described above, in the semiconductor device SD, a signal is transmitted between the first circuit C1 and the second circuit C2 through the first inductor IND1 and the second inductor IND2. If the first circuit C1 and the second circuit C2 are electrically connected with each other, the first circuit C1 and the second circuit C2 are destroyed due to differences in driving voltages. Therefore, the first circuit C1 and the second circuit C2 need to be electrically isolated from each other.

As shown in FIGS. 3 and 4, semiconductor device SD includes the substrate SUB in which a penetrating portion PP is formed. The penetrating portion PP is formed such that the penetrating portion PP surrounds the second circuit C2 in plan view. Thus, although the first circuit C1 and the second circuit C2 are formed on the substrate SUB, and can be electrically insulated from each other. As a result, the semiconductor device SD can be miniaturized in the present embodiment as compared with the case where the first circuit C1 and the second circuit C2 are formed on separate substrates, respectively.

Next, an exemplary method of manufacturing the semiconductor device SD according to the present embodiment will be described. FIGS. 5 to 11 are cross-sectional views showing exemplary steps included in the method of manufacturing the semiconductor device SD.

The method of manufacturing the semiconductor device SD according to the present embodiment includes (1) providing a semiconductor wafer SW, (2) forming a protective member PM, (3) polishing the substrate SUB, (4) forming the penetrating portion PP, (5) forming the embedded member EM, (6) bonding, and (7) sealing the semiconductor chip SCP.

(1) Providing a Semiconductor Wafer SW

Figure 5:
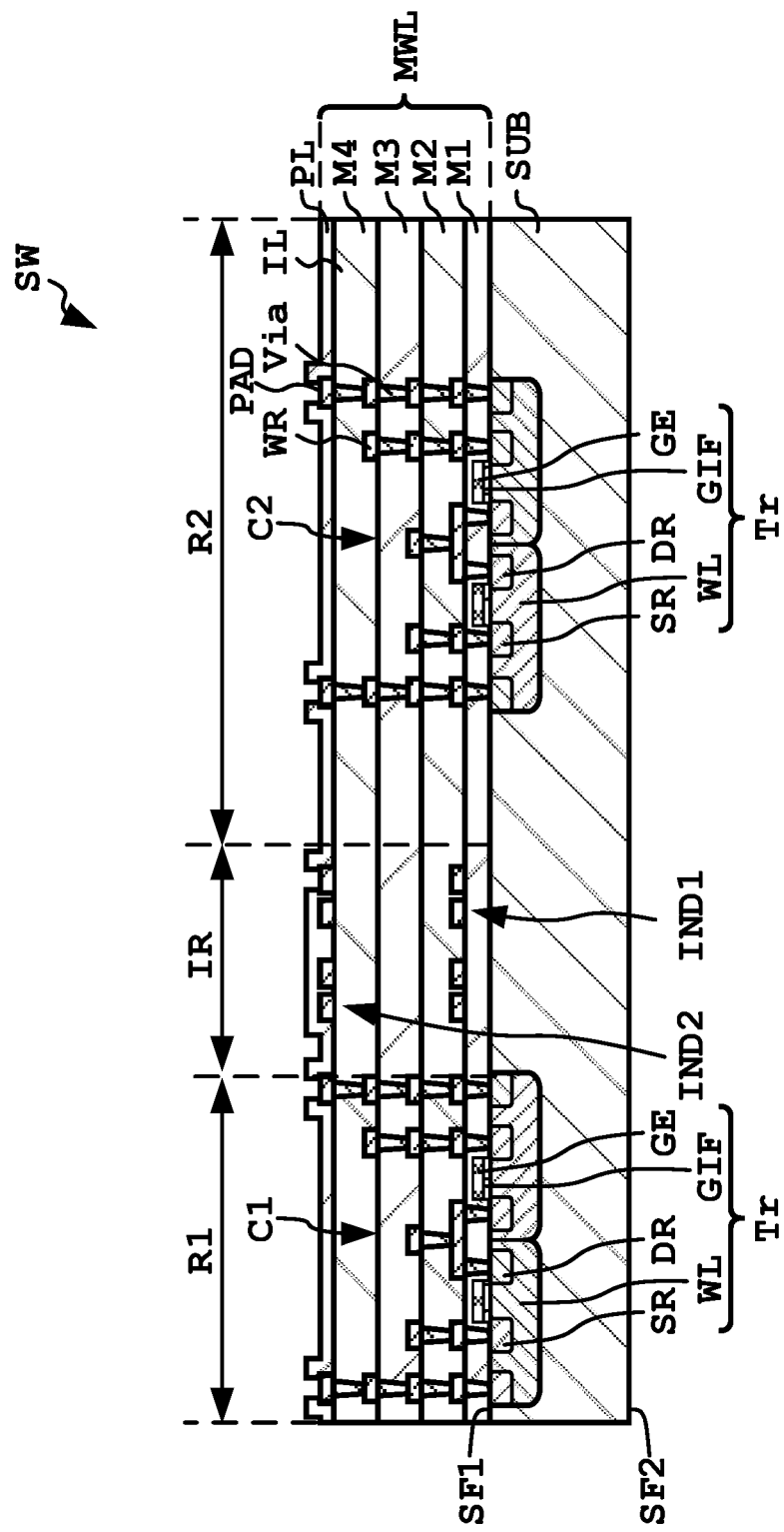
FIG. 5 is a cross-sectional view showing an exemplary step included in a method of manufacturing the semiconductor device according to the embodiment.

First, as shown in FIG. 5, a semiconductor wafer SW including the substrate SUB, the first circuit C1, the second circuit C2, the multilayer wiring layer MWL including the first inductor IND1 and the second inductor IND2, and the protective layer PL is provided. As a method of forming the semiconductor wafer SW, a method known in the art of a digital isolator can be employed.

(2) Forming a Protective Member PM

Figure 6:
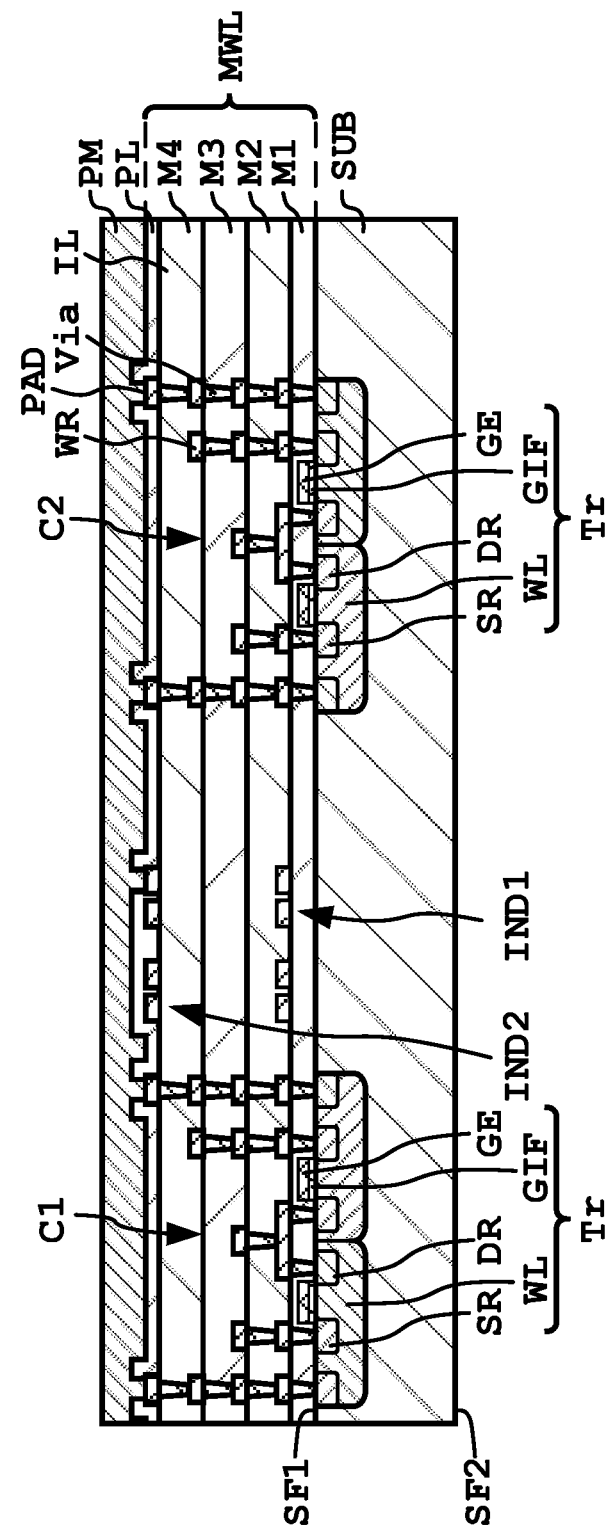
FIG. 6 is a cross-sectional view showing an exemplary step included in the method of manufacturing the semiconductor device according to the embodiment.

Next, as shown in FIG. 6, the protective member PM is disposed on the semiconductor wafer SW. In the present embodiment, the protective member PM is disposed on the protective layer PL. Examples of the protective member PM include a protective seal and a protective substrate. The material of the protective seal is, for example, vinyl chloride resin. The material of the protective substrate is, for example, glass.

(3) Polishing the Substrate SUB

Figure 7:
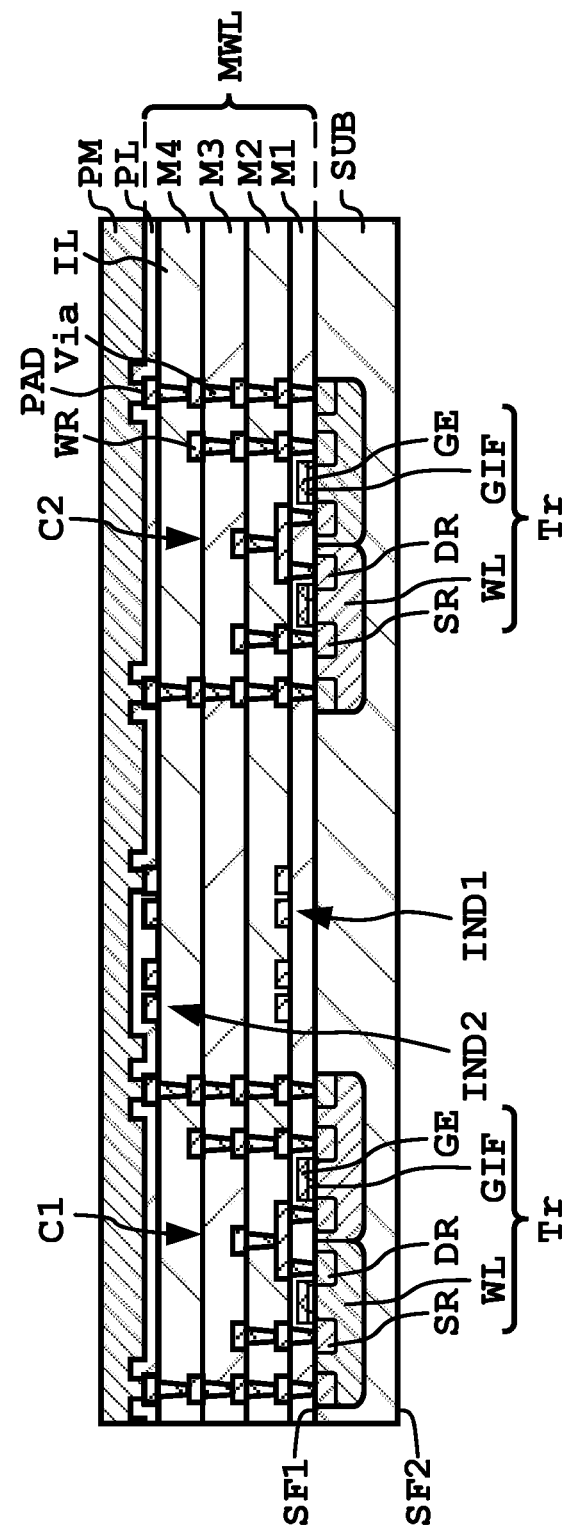
FIG. 7 is a cross-sectional view showing an exemplary step included in the method of manufacturing the semiconductor device according to the embodiment.

The second surface SF2 of the substrate SUB is then polished, as shown in FIG. 7. Thus, the thickness of the substrate SUB can be adjusted to a desired thickness. For example, the substrate SUB is polished so that the thickness of the substrate SUB is about 200 μm. A method of polishing the substrate SUB is, for example, a CMP (Chemical Mechanical Polishing) method. The polishing of the substrate SUB is performed with the protective member PM facing downward and the substrate SUB facing upward.

(4) Forming the Penetrating Portion PP

Figure 8:
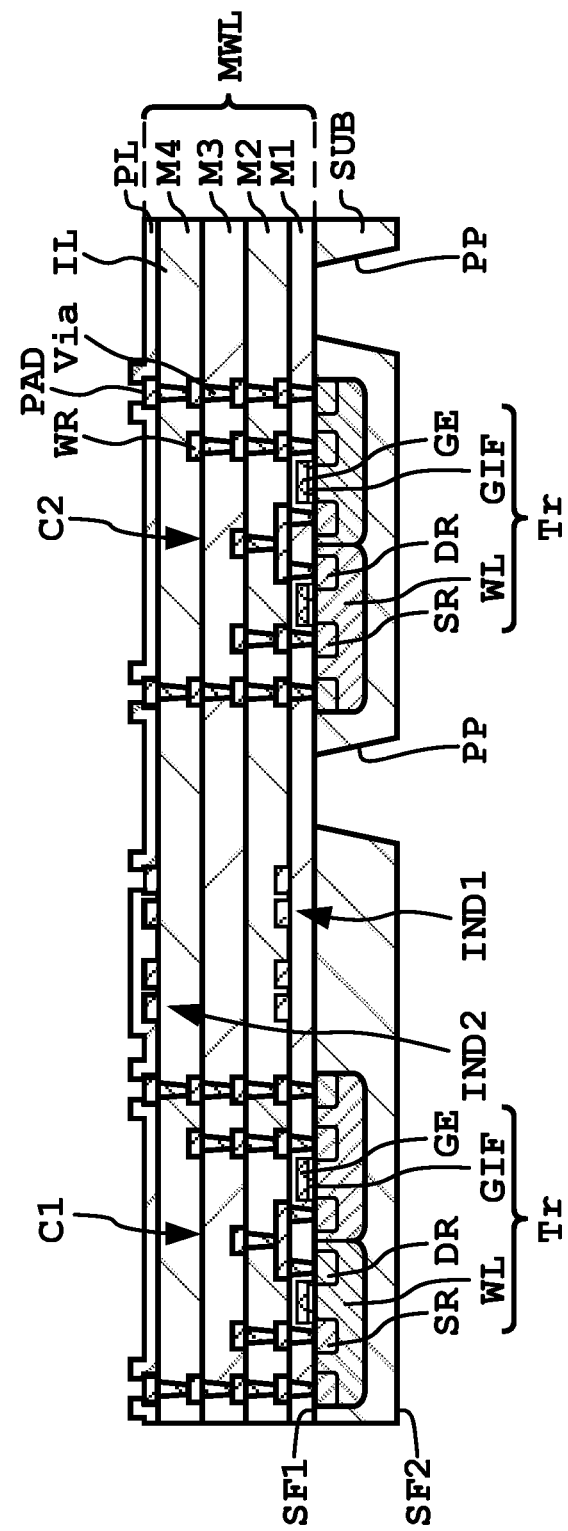
FIG. 8 is a cross-sectional view showing an exemplary step included in the method of manufacturing the semiconductor device according to the embodiment.

Next, as shown in FIG. 8, the penetrating portion PP is formed on the second surface SF2 of the substrate SUB. The penetrating portion PP may be formed by forming a mask on the second surface SF2 of the substrate SUB by photolithography and etching method, and then etching the substrate SUB using the mask as an etching mask. The penetrating portion PP is also formed with the protective member PM facing downward and the substrate SUB facing upward.

Examples of etching methods for substrate SUB include dry etching method and wet etching method. Examples of etchants used in wet etching method include potassium hydroxide (KOH) aqueous solution, tetramethylammonium hydroxide (TMAH) aqueous solution, ethylenediamine-pyrocatechol (EDP) aqueous solution, hydrazine (N2H) aqueous solution, sodium hydroxide aqueous solution and cesium hydroxide (CsOH) aqueous solution.

When the penetrating portion PP is formed by a wet etching method, the etching rate differs depending on the crystallographic orientation of the substrate SUB, so that the cross-sectional shape of the penetrating portion PP has a so-called trapezoidal shape. That is, in the cross section perpendicular to the extending direction of the penetrating portions PP, a width of the penetrating portion PP in the first surface SF1 is smaller than a width of the penetrating portion PP in the second surface SF2. Further, in the cross section, the width of the penetrating portions PP continuously increase from the first surface SF1 toward second surface SF2. For example, in the cross section, an angle formed by the side surfaces of the penetrating portions PP and the first surface SF1 of the substrate SUB is about 50°. Thus, it can be presumed that the penetrating portion PP is formed by the wet etching method.

When the penetrating portion PP is formed by a dry etching method, the cross-sectional shape of the penetrating portion PP in the cross section is substantially a quadrangle.

After the formation of the penetrating portion PP, the mask is removed.

(5) Forming the Embedded Member EM

Figure 9:
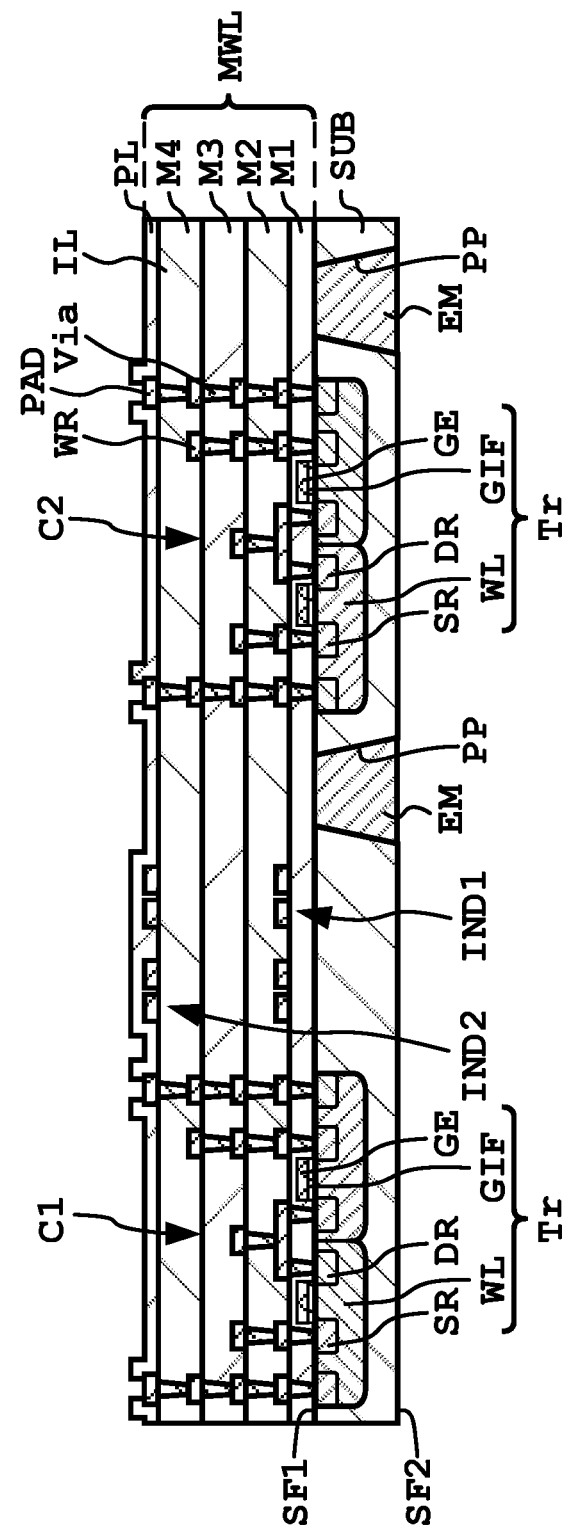
FIG. 9 is a cross-sectional view showing an exemplary step included in the method of manufacturing the semiconductor device according to the embodiment.

Next, as shown in FIG. 9, the embedded member EM is formed so as to embed in the penetrating portion PP. The method of forming the embedded member EM may be appropriately selected in accordance with the material of the embedded member EM. For example, when the embedded member EM is a resin layer, examples of the method of forming the embedded member EM include lithography method, mosquito method, and nanoimprint method. For example, the embedded member EM may be formed by providing the curable composition constituting the embedded member EM in the penetrating portion PP and then curing the curable composition. The curable composition may be a thermosetting composition or a photocurable composition. When the embedded member EM is an inorganic film, a method of forming the embedded member EM is, for example, CVD (Chemical Vapor Deposition) method. The embedded member EM is formed with the protective member PM facing downward and the substrate SUB facing upward. After the embedded member EM is formed, the protective member PM is removed.

(6) Bonding

Figure 10:
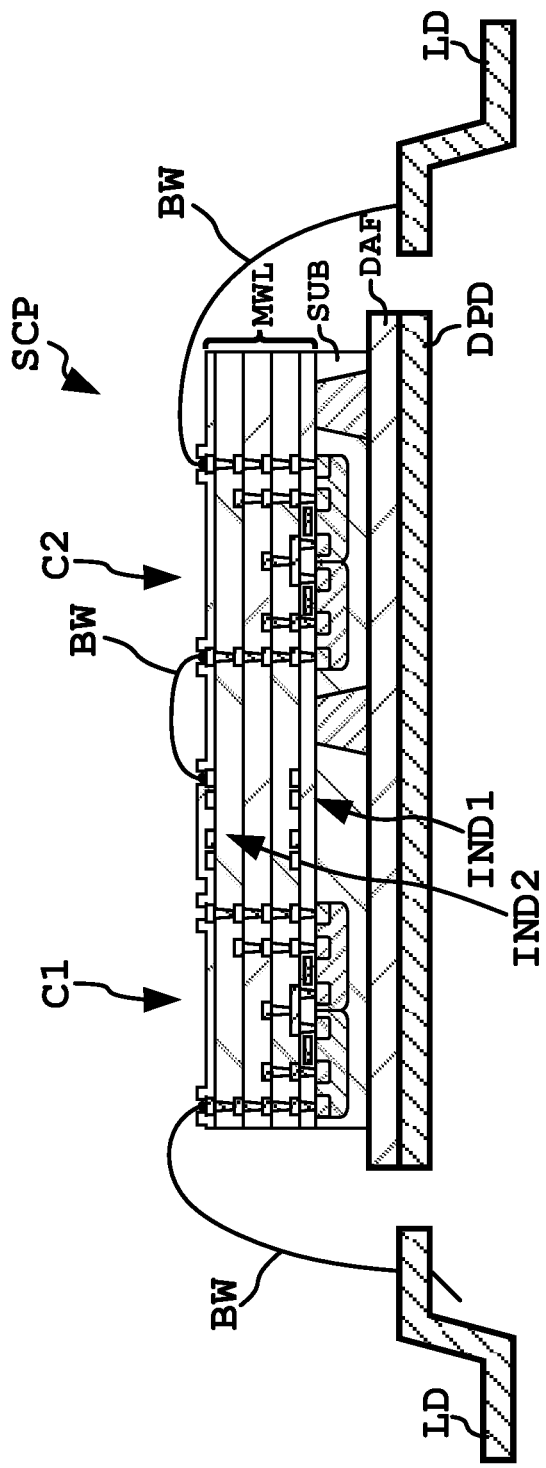
FIG. 10 a cross-sectional view showing an exemplary step included in the method of manufacturing the semiconductor device according to the embodiment.

Next, as shown in FIG. 10, the semiconductor chip SCP and the lead LD are electrically connected with each other. Specifically, first, the semiconductor wafer SW is diced to obtain a plurality of singulated semiconductor chips SCP. Next, the semiconductor chip SCP is fixed on the die pad DPD through the adhesive layer DAF. Next, the pad PAD and the lead LD are electrically connected through the bonding wire BW. In the present embodiment, the second circuit C2 and hte second inductor IND2 are electrically connected with each other through the bonding wire BW.

(7) Sealing the Semiconductor Chip SCP

Figure 11:
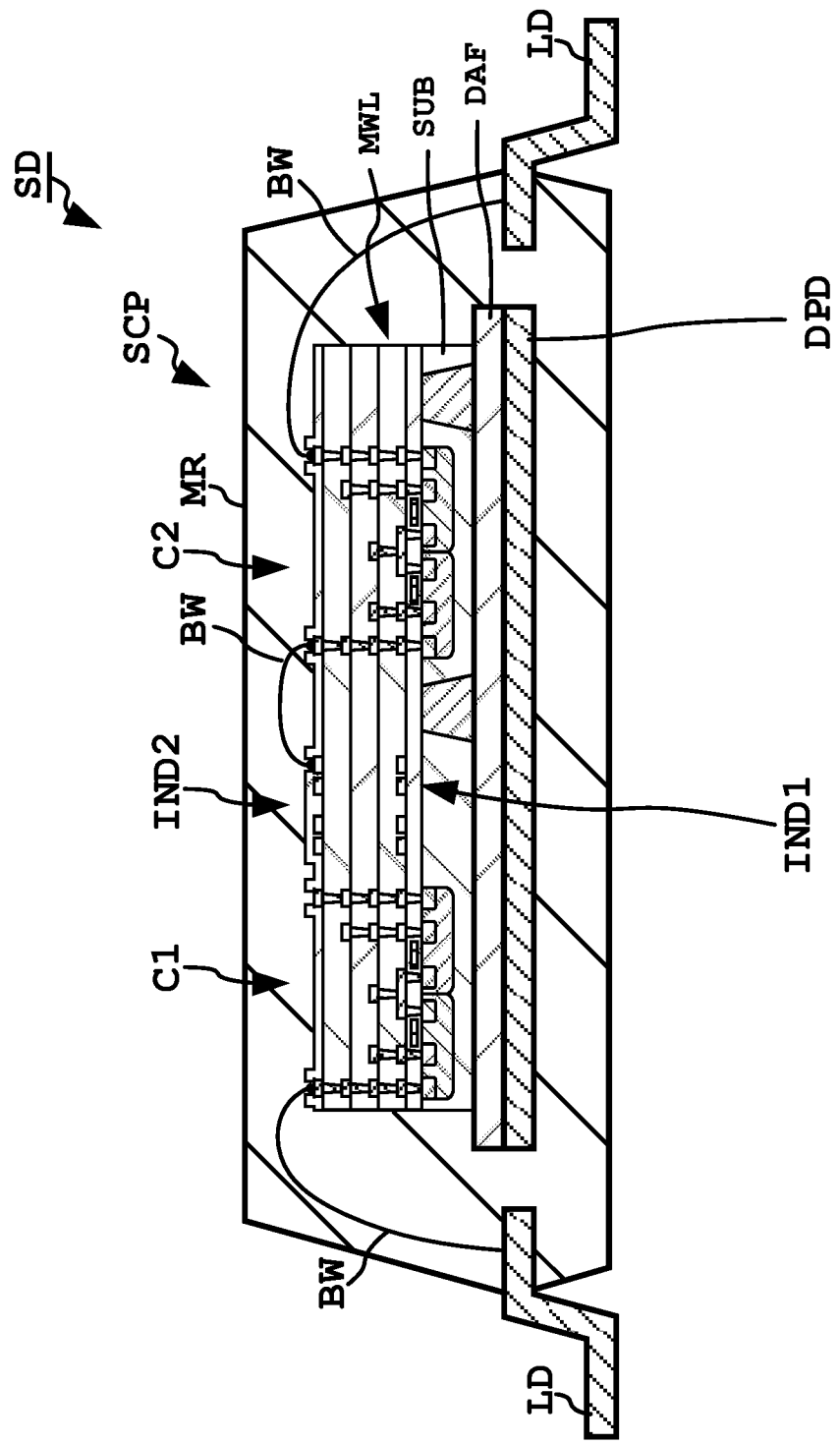
FIG. 11 a cross-sectional view showing an exemplary step included in the method of manufacturing the semiconductor device according to the embodiment.

Next, as shown in FIG. 11, the die pad DPD, the portion of the lead LD, the semiconductor chip SCP, and the bonding wire BW are sealed with a sealing resin MR.

The semiconductor device SD according to the present embodiment can be manufactured by the above manufacturing method. In the present embodiment, the first circuit C1 and the second circuit C2 are both formed on the substrate SUB. Therefore, there is no need to assemble the semiconductor chip having the first circuit C1 and the semiconductor chip having the second circuit C2. As a result, the semiconductor device SD according to the present embodiment can be manufactured inexpensively.

(Effect)

The semiconductor device SD according to the present embodiment includes the substrate SUB in which the penetrating portion PP for electrically isolating the first circuit C1 and the second circuit C2 from each other is formed. Therefore, the first circuit C1 and the second circuit C2 can be formed on the substrate SUB. As a result, semiconductor device SD can be miniaturized.

[First Modification]

Figure 12:
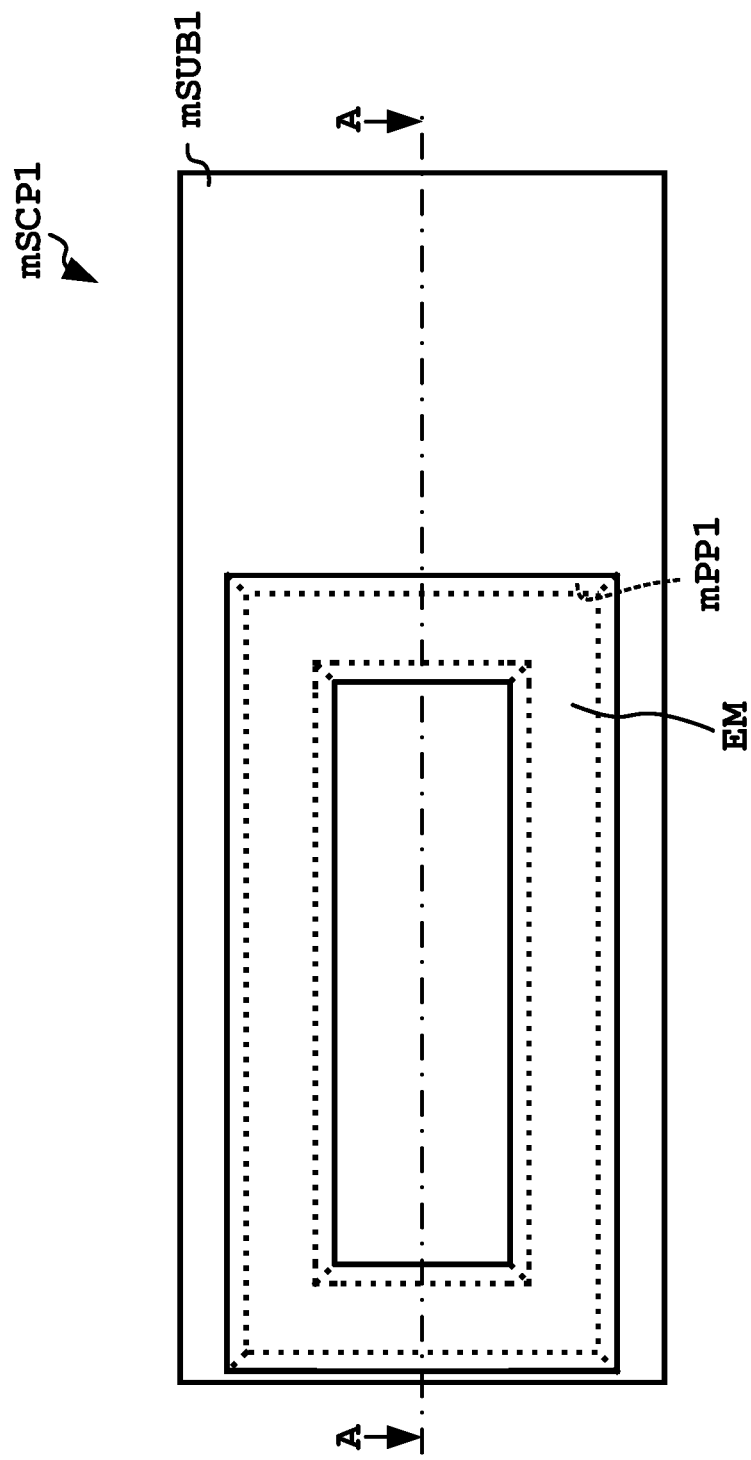
FIG. 12 is a plan view showing a main portion of a semiconductor chip according to a first modification of the embodiment.
Figure 13:
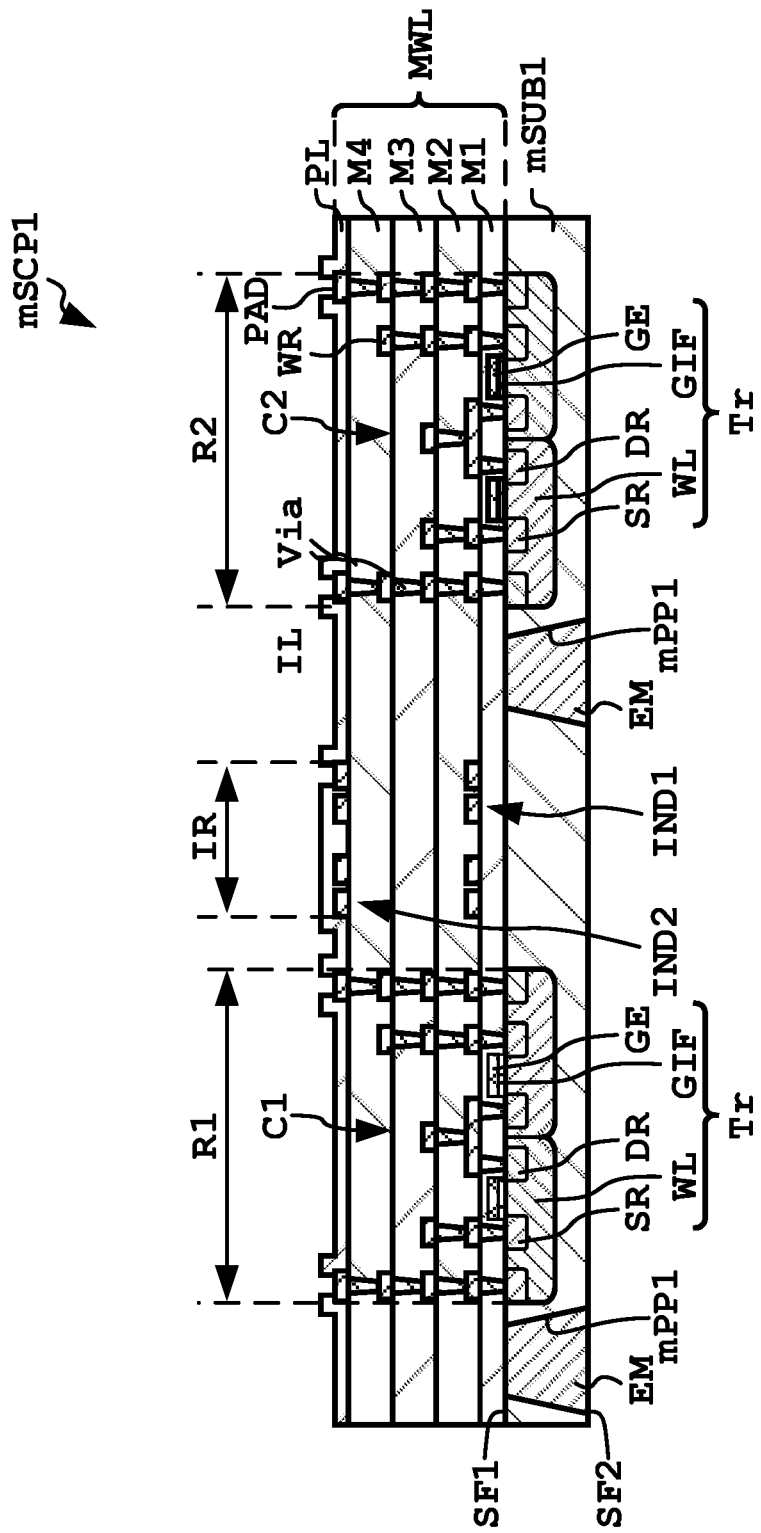
FIG. 13 is a cross-sectional view showing the main portion of the semiconductor chip according to the first modification of the embodiment.

FIG. 12 is a plan view showing a main portion of a semiconductor chip mSCP1 according to a first modification of the present embodiment. FIG. 13 is a cross-sectional view showing a main portion of the semiconductor chip mSCP1 according to the first modification of the present embodiment. FIG. 13 is a cross-sectional view taken along line A-A in FIG. 12.

The semiconductor chip mSCP1 includes a substrate mSUB1 in which a penetrating portion mPP1 is formed. In first modification, the penetrating portion mPP1 is formed such that the penetrating portion mPP1 surrounds the first region R1 and the inductor region IR in plan view. In other words, the penetrating portion mPP1 surrounds the first circuit C1, the first inductor IND1, and the second inductor IND2 in plan view.

[Second Modification]

Figure 14:
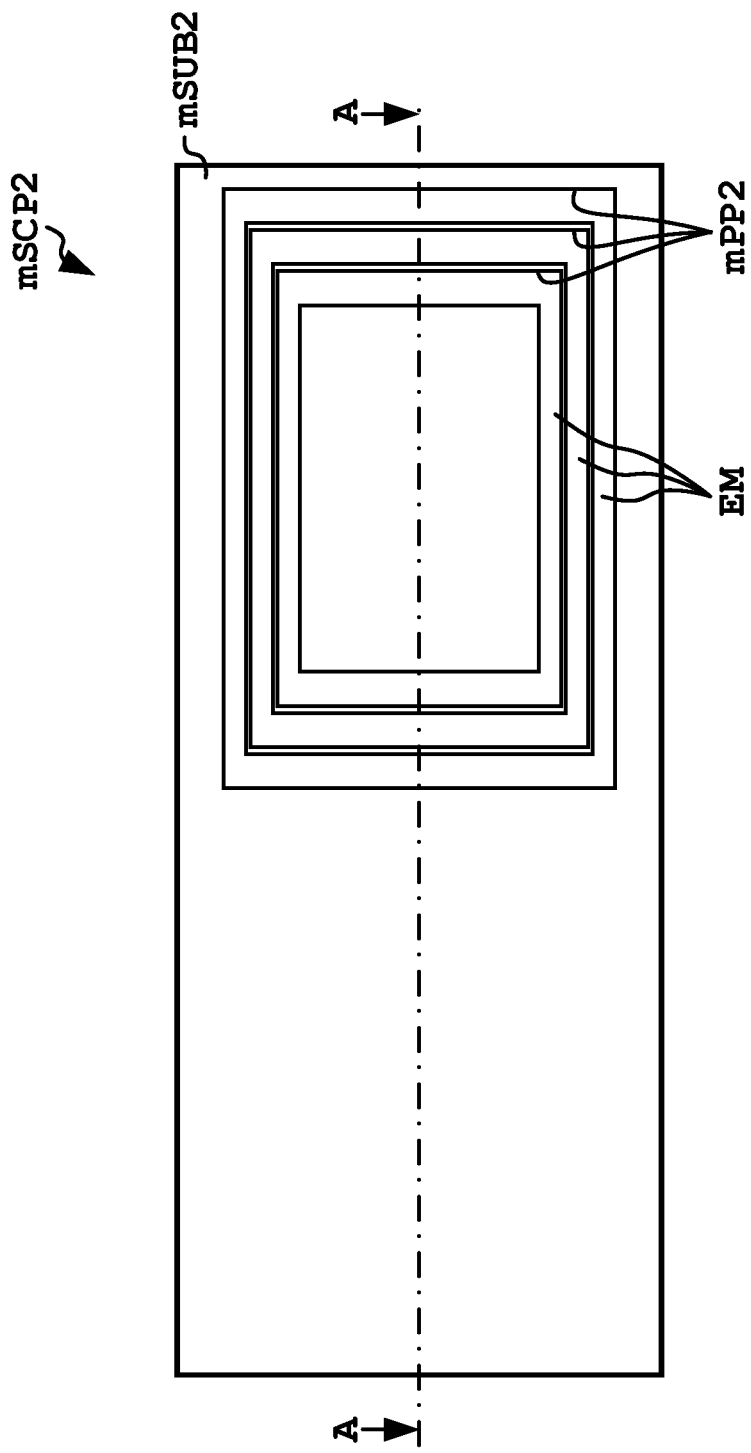
FIG. 14 is a plan view showing a main portion of a semiconductor chip according to a second modification of the embodiment.
Figure 15:
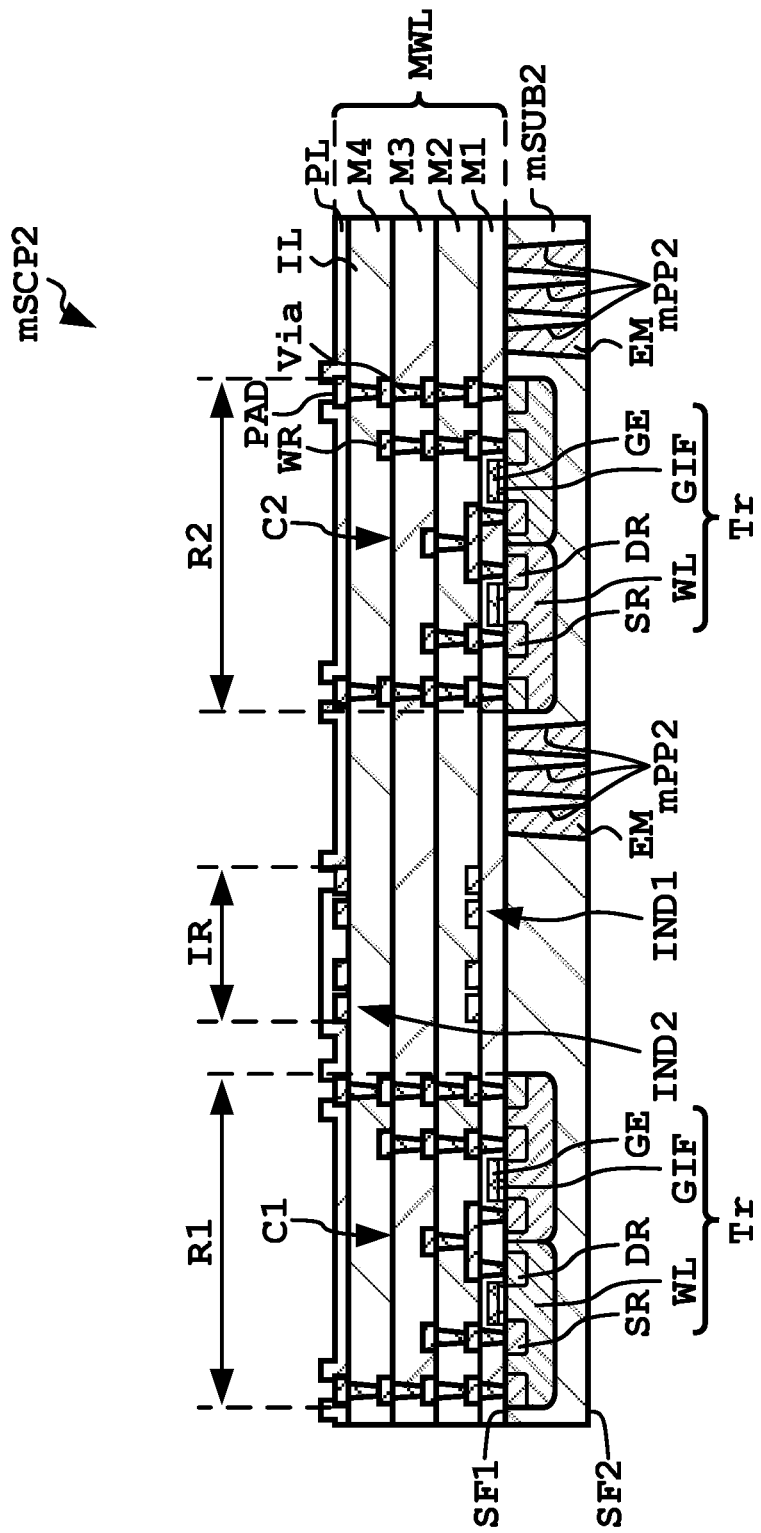
FIG. 15 is a cross-sectional view showing the main portion of the semiconductor chip according to the second modification of the embodiment.

FIG. 14 is a plan view showing a main portion of a semiconductor chip mSCP2 according to a second modification of the present embodiment. FIG. 15 is a cross-sectional view showing a main portion of the semiconductor chip mSCP2 according to the second modification of the present embodiment. FIG. 15 is a cross-sectional view taken along line A-A in FIG. 14.

The semiconductor chip mSCP2 includes a substrate mSUB2 in which a plurality of penetrating portions mPP2 are formed. In second modification, the number of the penetrating portion mPP2 is three. The three penetrating portions mPP2 surround the second circuits C2 in plan view. The three penetrating portions mPP2 are arranged in parallel with each other. This increases the aspect ratio which is a ration of a depth of the penetrating portion mPP2 to a width of the penetrating portion mPP2. As a result, the embedding property of the embedded member EM with respect to the penetrating portion mPP2 is increased.

[Third Modification]

Figure 16:
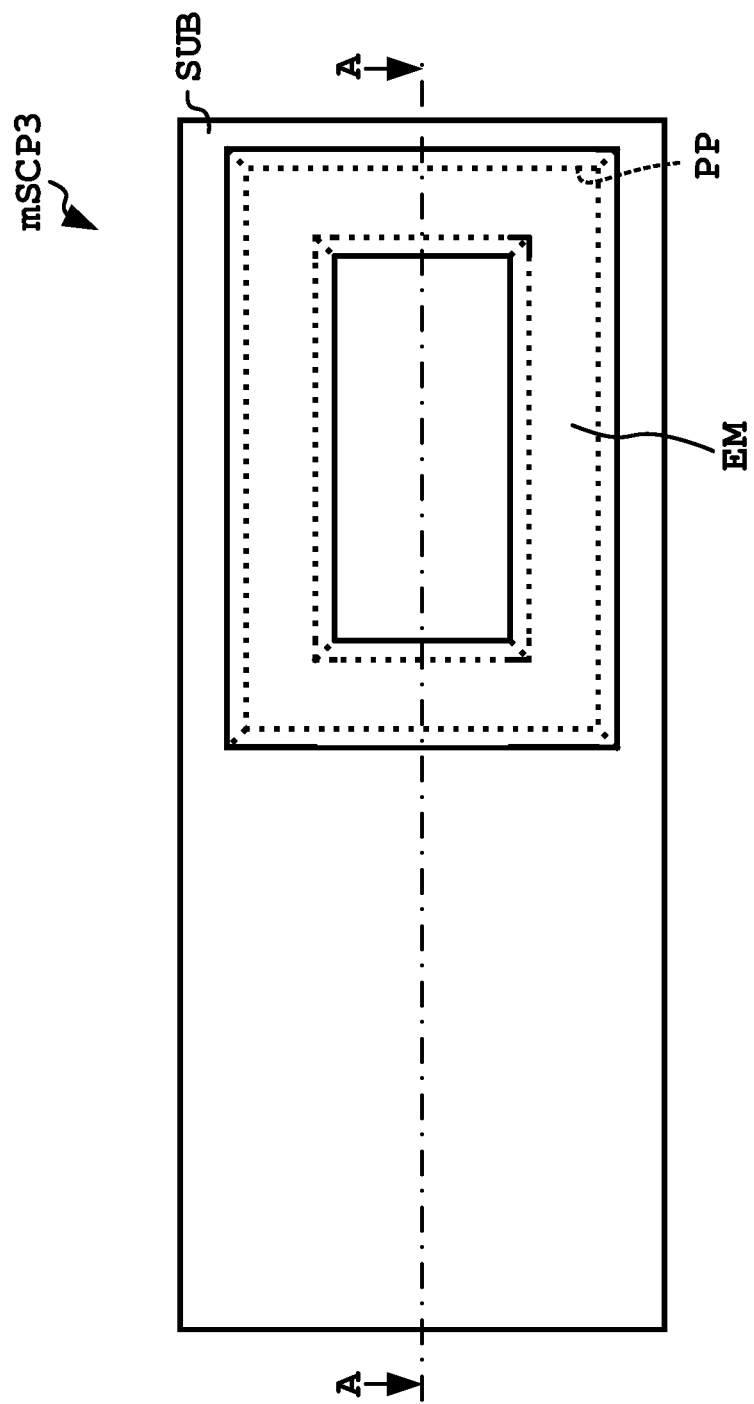
FIG. 16 is a plan view showing a main portion of a semiconductor chip according to a third modification of the embodiment.
Figure 17:
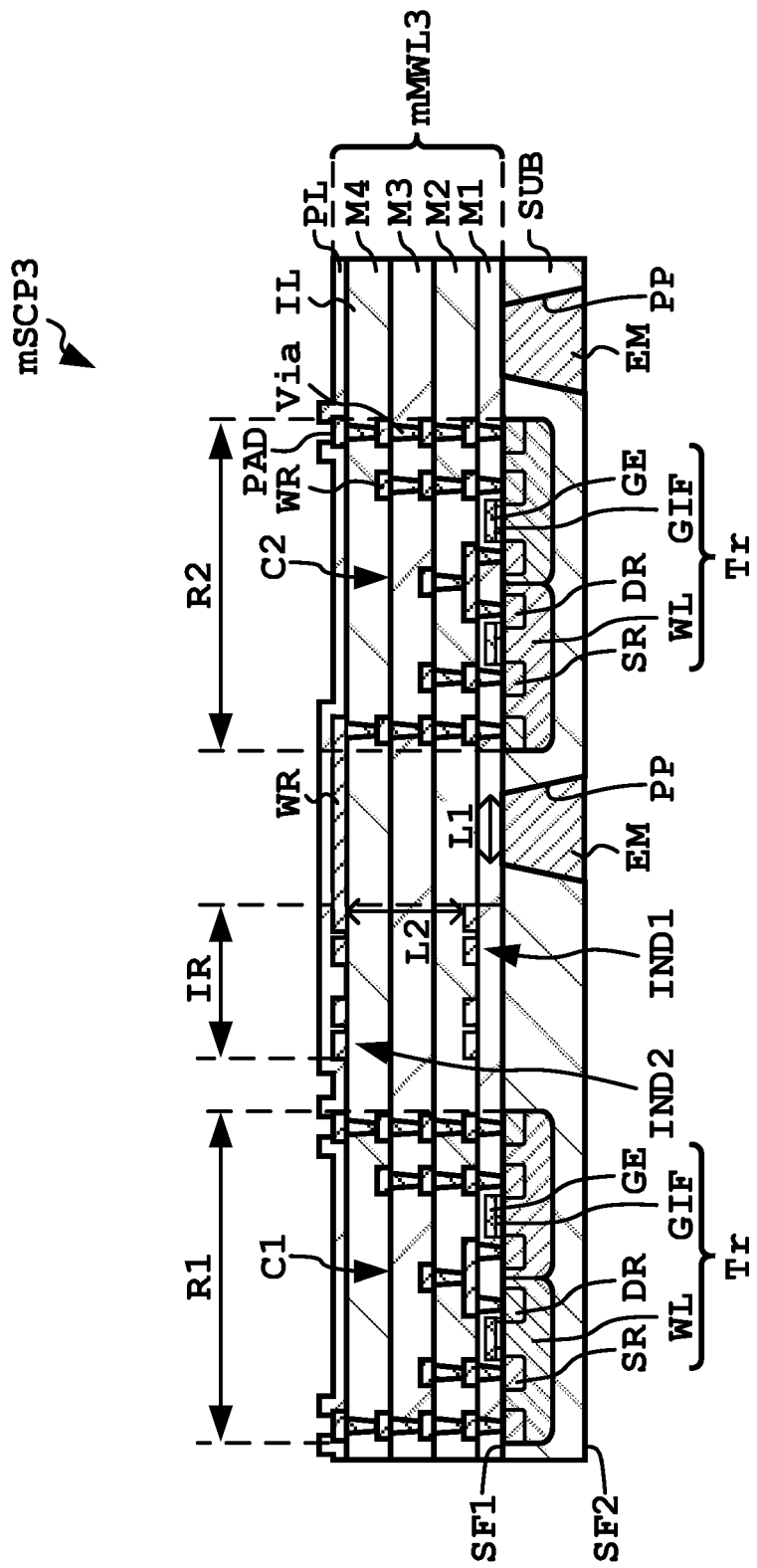
FIG. 17 is a cross-sectional view showing the main portion of the semiconductor chip according to the third modification of the embodiment.

FIG. 16 is a plan view showing a main portion of a semiconductor chip mSCP3 according to a third modification of the present embodiment. FIG. 17 is a cross-sectional view showing a main portion of the semiconductor chip mSCP3 according to the third modification of the present embodiment. FIG. 17 is a cross-sectional view taken along line A-A in FIG. 16.

In the semiconductor chip mSCP3, the second inductor IND2 is electrically connected with the second circuit C2 through the wiring WR of the multilayer wiring layer mMWL3. This eliminates the need for a bonding step and facilitates assembly. In addition, the semiconductor chip mSCP3 can be reduced in size as compared in the case wire bonding is used. In the third modification, the penetrating portion PP overlaps with the wiring WR of the multilayer wiring layer mMWL3 in plan view.

Figure 18:
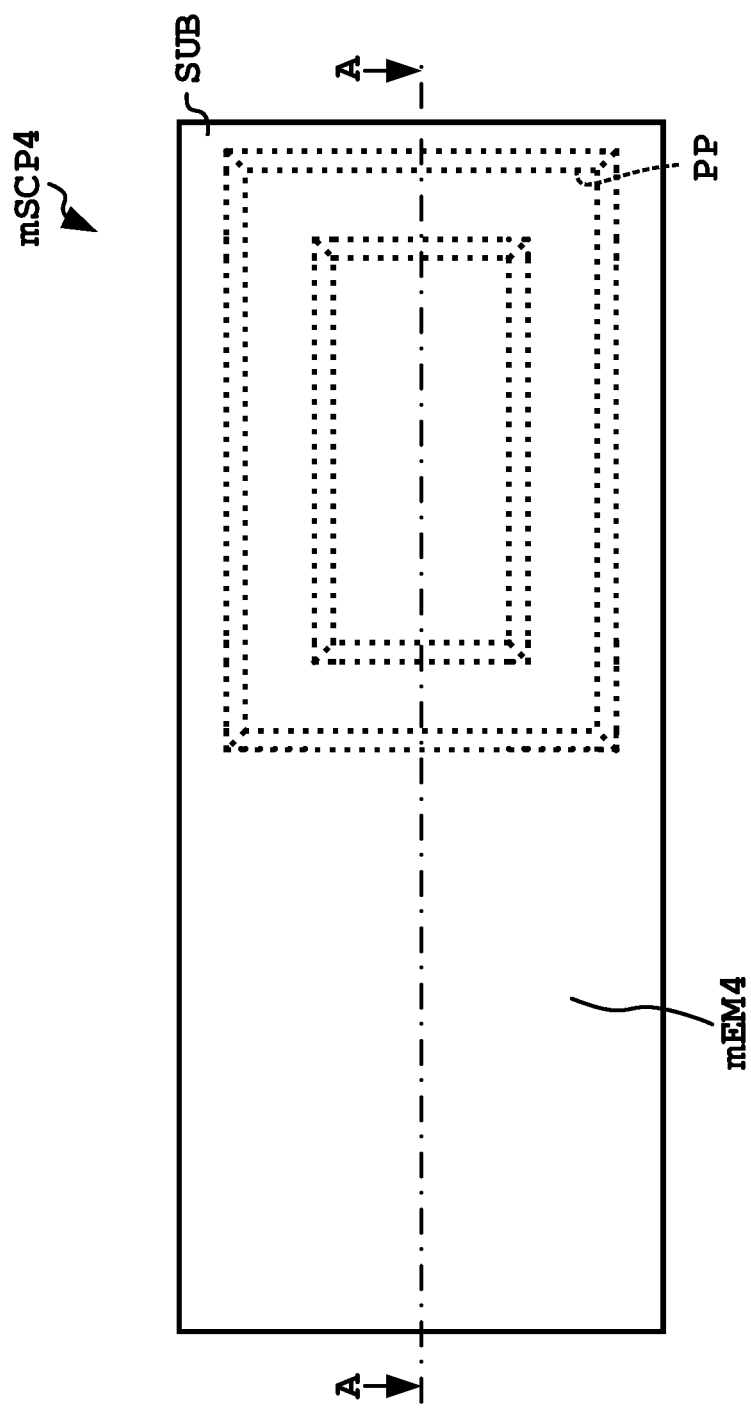
FIG. 18 is a plan view showing a main portion of a semiconductor chip according to a fourth modification of the embodiment.
Figure 19:
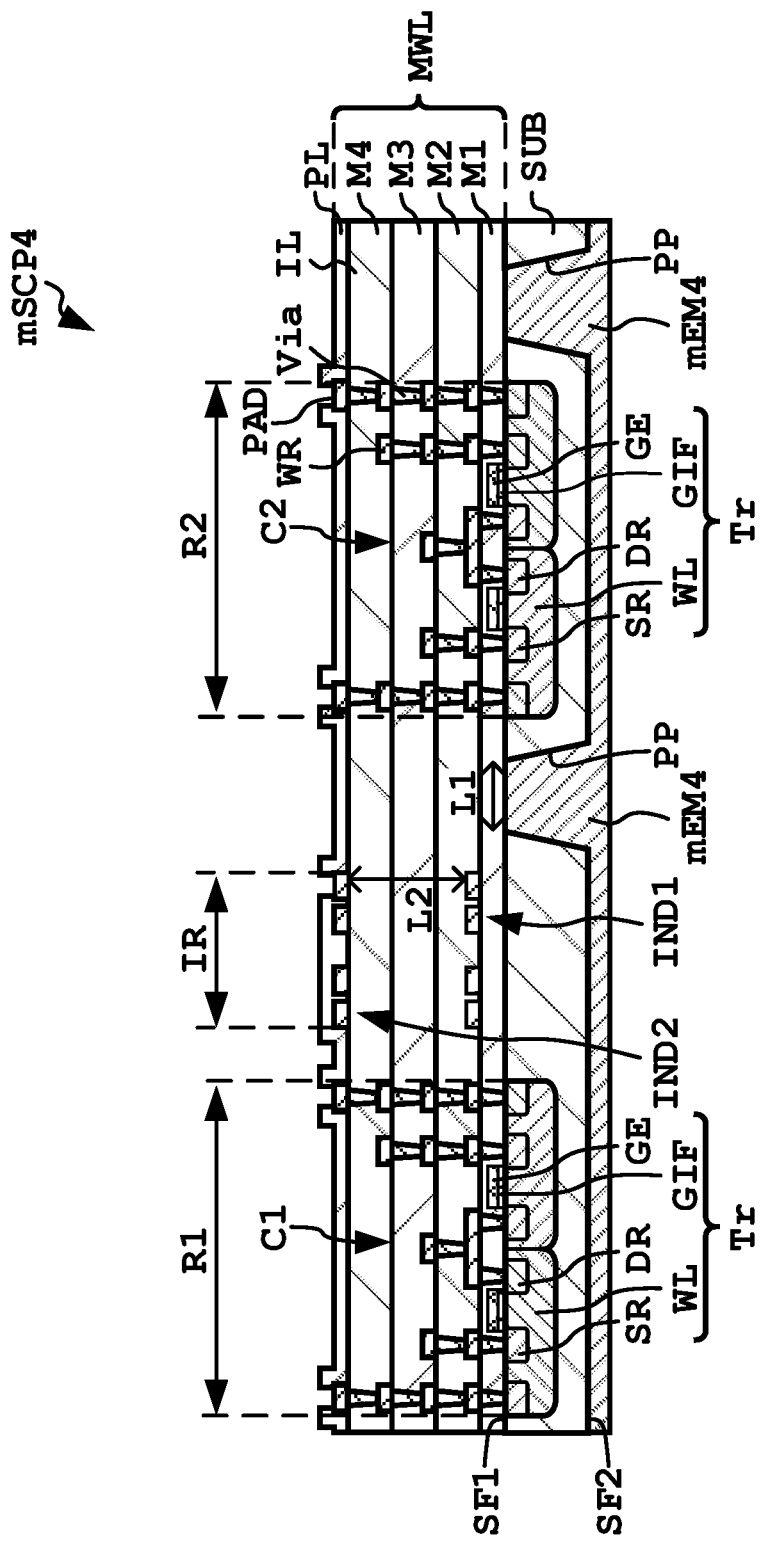
FIG. 19 is a cross-sectional view showing the main portion of the semiconductor chip according to the fourth modification of the embodiment.

FIG. 18 is a plan view showing a main portion of a semiconductor chip mSCP4 according to a fourth modification of the present embodiment. FIG. 19 is a cross-sectional view showing the main portion of the semiconductor chip mSCP4 according to the fourth modification of the present embodiment. FIG. 19 is a cross-sectional view taken along line A-A in FIG. 18.

In the semiconductor chip mSCP4, the embedded member mEM4 is formed inside the penetrating portion PP and over the second surface SF2 of the substrate SUB. As the material of the adhesive layer DAF, a material having conductivity can be used. The conductive adhesive layer DAF is, for example, a solid material of a conductive paste such as a gold paste and a silver paste.

It should be noted that the present invention is not limited to the above-mentioned embodiment, and various modifications can be made without departing from the gist thereof. For example, the penetrating portion PP formed in the substrate SUB may be cavities. That is, the embedded member EM may not be formed in the penetrating portion PP. In the above embodiment, the penetrating portion PP surrounds one of the first circuit C1 and the second circuit C2 in plan view. However, the penetrating portion PP may surround both the first circuit C1 and the second circuit C2 in plan view. In this instance, for example, the first circuit C1 is surrounded by a first penetrating portion in plan view, and the second circuit C2 is surrounded by a second penetrating portion in plan view. The first penetrating portion and the second penetrating portion may be integral or separate.

In the above embodiment, in the cross section perpendicular to the extending direction of the penetrating portion PP, the width of the penetrating portion PP in the first surface SF1 is smaller than the width of the penetrating portion PP in second surface SF2, but the present invention is not limited thereto in other embodiments. For example, in the cross section perpendicular to the extending direction of the penetrating portion PP, the width of the penetrating portion PP in the first surface SF1 may be greater than the width of the penetrating portion PP in second surface SF2. Further, at the cross section, the width of the penetrating portions PP may be continuously decreased from the first surface SF1 toward second surface SF2.

In addition, even when a specific numerical value example is described, it may be a numerical value exceeding the specific numerical value, or may be a numerical value less than the specific numerical value, except when it is theoretically obviously limited to the numerical value. In addition, the component means "B containing A as a main component" or the like, and the mode containing other components is not excluded.

What is claimed is:

1. A semiconductor device comprising:
   a substrate comprising a first region and a second region which are regions differing from each other, the substrate having a first surface and a second surface which are opposite each other;
   a first circuit formed on the first surface in the first region;
   a second circuit formed on the first surface in the second region;
   a penetrating portion formed in the substrate to extend from the first surface to the second surface of the substrate such that the penetrating portion opens to both the first surface and the second surface;
   a multilayer wiring layer formed on the first surface of the substrate;
   a first inductor electrically connected with the first circuit; and
   a second inductor electrically connected with the second circuit,
   wherein the first inductor and the second inductor are formed in the multilayer wiring layer such that the first inductor and the second inductor face each other in a direction perpendicular to the first surface of the substrate, and
   wherein, in plan view, the penetrating portion surrounds one of the first circuit and the second circuit.

2. The semiconductor device according to claim 1, wherein, in plan view, the penetrating portion surrounds the first inductor and the second inductor.

3. The semiconductor device according to claim 1, wherein an embedded member having insulating property is embedded in the penetrating portion.

4. The semiconductor device according to claim 3, wherein the embedded member is formed in the penetrating portion and on a back surface of the substrate.

5. The semiconductor device according to claim 3, wherein a material of the embedded member is a resin.

6. The semiconductor device according to claim 3, wherein a material of the embedded member contains one or both of an oxygen atom and a nitrogen atom.

7. The semiconductor device according to claim 3, wherein a material of the embedded member is an oxide layer or a nitride layer.

8. The semiconductor device according to claim 1,
   wherein, in cross section perpendicular to an extending direction of the penetrating portion, a width of the penetrating portion in the first surface is smaller than a width of the penetrating portion in the second surface.

9. The semiconductor device according to claim 1, wherein, in plan view, the penetrating portion is formed in an area different from the first inductor and the second inductor.

10. The semiconductor device according to claim 1, comprising a die pad supporting the substrate,
    wherein the substrate is fixed on the die pad through an adhesive layer having insulating property.

11. The semiconductor device according to claim 1, wherein the second inductor and the second circuit are connected each other through a wiring in the multilayer wiring layer.

12. The semiconductor device according to claim 1, wherein a number of penetrating portion is two or more.

13. The semiconductor device according to claim 1, wherein, in cross section perpendicular to an extending direction of the penetrating portion, a distance between the first inductor and the second inductor in a facing direction of the first inductor and the second inductor is smaller than a width of the penetrating portion.

14. A method of manufacturing a semiconductor device, comprising:
    providing a semiconductor wafer comprising:
        a substrate comprising a first region and a second region which are regions differing from each other, the substrate having a first surface and a second surface which are opposite each other;
        a first circuit formed on the first surface in the first region;
        a first inductor electrically connected with the first circuit;
        a second circuit formed on the first surface in the second region; and
        a second inductor electrically connected with the second circuit,
        wherein the first inductor and the second inductor are formed to face each other in a direction perpendicular to the first surface of the substrate; and
    forming a penetrating portion in the substrate to extend from the first surface to the second surface such that the penetrating portion opens to both the first surface and the second surface,
    wherein the penetrating portion is formed to surround the first circuit or the second circuit in plan view.

15. The method of manufacturing a semiconductor device according to claim 14, wherein forming the penetrating portion is performed by wet etching method.

16. The method of manufacturing a semiconductor device according to claim 14, wherein, in plan view, the penetrating portion surrounds the first inductor and the second inductor.

17. The method of manufacturing a semiconductor device according to claim 14, comprising embedding the penetrating portion with an embedded member having insulating property.

18. The method of manufacturing a semiconductor device according to claim 17, wherein a material of the embedded member is a resin.

19. The method of manufacturing a semiconductor device according to claim 17, wherein a material of the embedded member comprises one or both of oxygen atom and nitrogen atom.

20. The method of manufacturing a semiconductor device according to claim 19, wherein the material of the embedded member is an oxide film or nitride material.

* * * * *